United States Patent
Song et al.

(10) Patent No.: US 12,396,252 B2
(45) Date of Patent: Aug. 19, 2025

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Jhu-Min Song, Nantou County (TW); Chien-Chih Chou, New Taipei (TW); Yu-Chang Jong, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 547 days.

(21) Appl. No.: 17/824,936

(22) Filed: May 26, 2022

(65) Prior Publication Data
US 2023/0387110 A1    Nov. 30, 2023

(51) Int. Cl.
*H10D 84/83*    (2025.01)
*H10D 64/01*    (2025.01)
*H10D 84/01*    (2025.01)
*H10D 84/03*    (2025.01)

(52) U.S. Cl.
CPC ......... *H10D 84/834* (2025.01); *H10D 64/017* (2025.01); *H10D 84/0151* (2025.01); *H10D 84/0158* (2025.01); *H10D 84/038* (2025.01)

(58) Field of Classification Search
CPC ............... H10D 84/834; H10D 64/017; H10D 84/0151; H10D 84/0158; H10D 84/038; H10D 18/40; H10D 64/252; H10D 84/0107; H10D 1/694; H10D 1/66; H10D 30/797; H10D 64/514; H10D 84/0128; H10D 84/0144; H10D 84/0142; B65D 83/141; H10F 30/2863; A23B 2/783; A45C 11/003
USPC ....................................................... 257/392
See application file for complete search history.

(56) References Cited

U.S. PATENT DOCUMENTS

| | | | |
|---|---|---|---|
| 10,734,381 B2 * | 8/2020 | Zhou ................... | H10D 84/0158 |
| 11,728,429 B2 * | 8/2023 | Lee .................... | H10D 30/0278 |
| | | | 257/192 |
| 2023/0197523 A1 * | 6/2023 | Hsu ...................... | H10D 84/038 |
| | | | 257/392 |

* cited by examiner

Primary Examiner — Tan N Tran
(74) Attorney, Agent, or Firm — WPAT LAW; Anthony King

(57) ABSTRACT

A semiconductor structure includes a substrate, a first FET device and a second FET device. The substrate has a first region and a second region. The first FET device is in the first region, and the second FET device is in the second region. The first FET device includes a first isolation structure, a first gate electrode disposed over a portion of the first isolation structure, and a first gate dielectric layer between the substrate and the first gate electrode. The first gate dielectric layer has a first thickness. The second FET device includes a plurality of fin structures, a plurality of second isolation structures, a second gate electrode over the plurality of fin structures, and a second gate dielectric layer between the second gate electrode and the plurality of fin structures. The second gate dielectric layer has a second thickness. The second thickness is less than the first thickness.

20 Claims, 25 Drawing Sheets

SEMICONDUCTOR STRUCTURE AND METHOD FOR FORMING THE SAME

BACKGROUND

The electronics industry is experienced an ever-increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far, such goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices requires similar advances in semiconductor manufacturing processes and technology.

As technology nodes achieve progressively smaller scales, in some IC designs, researchers seek to replace a typical polysilicon gate with a metal gate to improve device performance by decreasing feature sizes. One approach to forming the metal gate is called a "gate-last" approach, sometimes referred to as a replacement polysilicon gate (RPG) approach. In the RPG approach, the metal gate is fabricated last, which allows for a reduced number of subsequent operations.

Further, as the dimensions of a transistor decrease, a thickness of a gate dielectric layer may be reduced to maintain performance with a decreased gate length. In order to reduce gate leakage, a high dielectric constant (high-k or HK) gate dielectric layer is used to provide a thickness as effective as that provided by a typical gate oxide used in larger technology nodes. A high-k metal gate (HKMG) approach including a metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
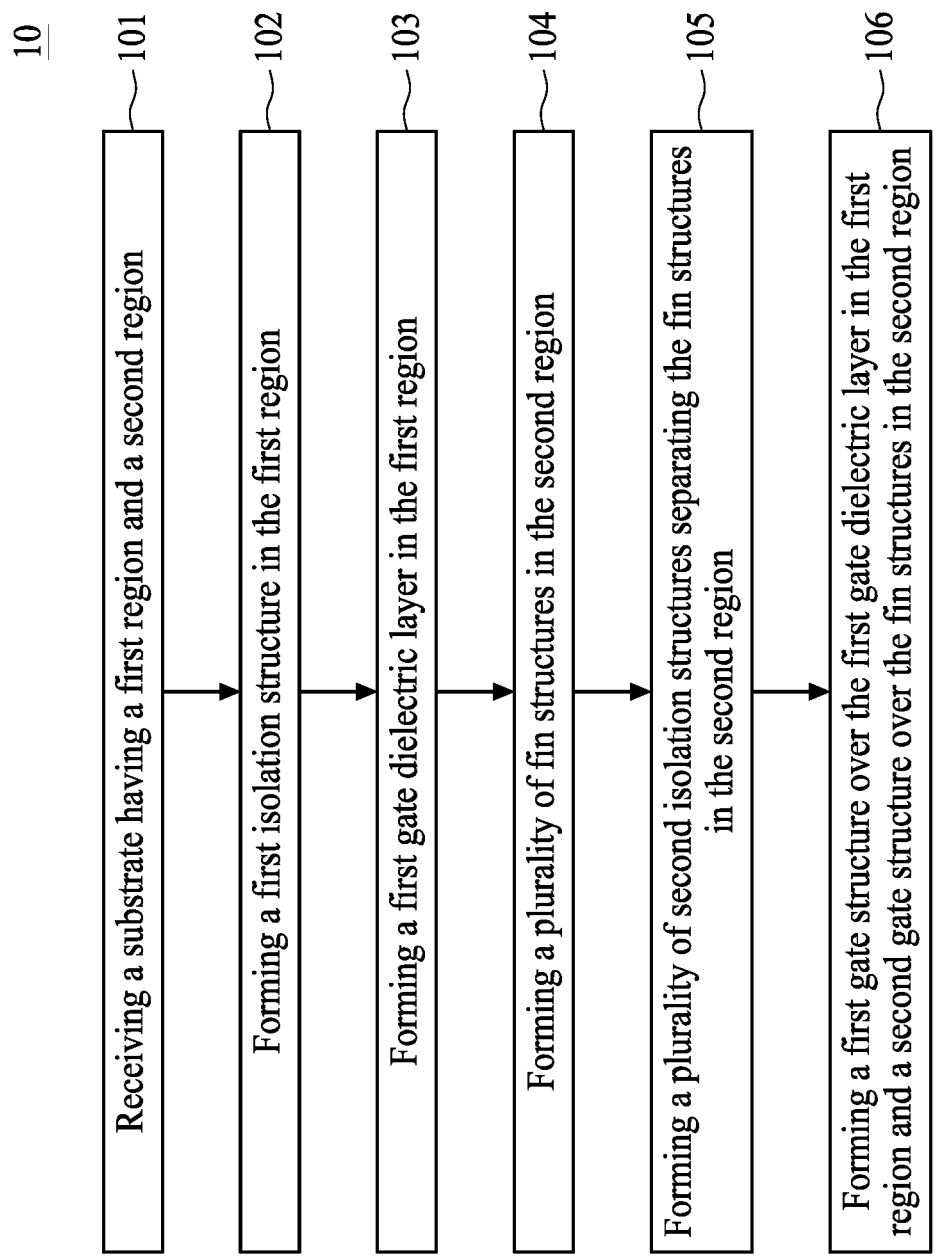
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

With ongoing down-scaling of integrated circuits, power supply voltages of the circuits may be reduced. However, the voltage reduction may be different in different circuits or regions. For example, threshold voltage (Vt) requirements of memory circuits may be different from those of core circuits. A multiple-Vt capability is therefore desired for device design.

However, integration of a multiple-Vt device in a FinFET device can raise some issues. In some comparative approaches, a ratio of a thicknesses of a gate dielectric layer of a high-voltage (HV) device to a thickness of a gate dielectric layer of a low-voltage (LV) device may range from approximately 3.0 to approximately 8. It is difficult to integrate the two gate dielectric layers having such different thicknesses. Further, the HV device may need an isolation structure of greater dimension. Such isolation structure may weaken or damage fin structures.

Embodiments of a method for forming a semiconductor structure are therefore provided. The semiconductor structure is formed in an HKMG process in accordance with the embodiments. The semiconductor structure includes both a planar device and a non-planar device in some embodiments, for example but not limited to a FinFET device. In some embodiments, the method includes formation of isolation structures for an HV device prior to formation of an isolation structure for an LV FinFET device. In some embodiments, the method include formation of a gate dielectric layer for the HV device prior to formation of a gate dielectric layer for the LV FinFET device. In some embodiments, the method provides a boundary dummy between the HV device and the LV FinFET device. According to the method, the issue of the gate dielectric layer and the issue of the depth of the isolation structures for the HV devices may be mitigated when integrating the formation of the HV device with the formation of the FinFET device.

FIG. 1 is a flowchart representing a method for forming a semiconductor structure 10 according to aspects of the present disclosure. The method 10 includes a number of operations (101, 102, 103, 104, 105 and 106). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may just be briefly described herein. Thus, other implementations are possible within the scope of the various aspects described herein.

Figure 2:
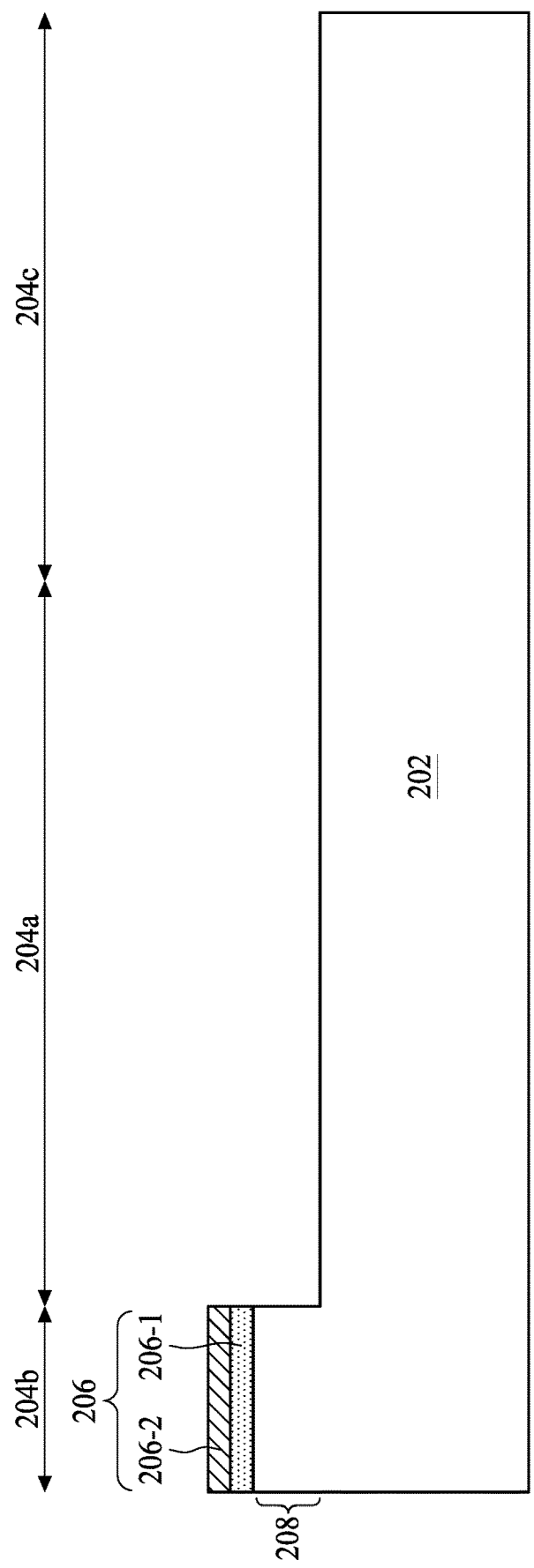
FIGS. 2 to 14 are schematic drawings illustrating the semiconductor structure at various fabrication stages according to aspects of the present disclosure in one or more embodiments.

FIGS. 2 to 20B are schematic drawings illustrating the semiconductor structure at various fabrication stages according to aspects of the present disclosure in one or more embodiments. Referring to FIG. 2, in some embodiments, in operation 101, the method 10 includes receiving a substrate 202 having a first region 204a and a second region 204b, but the disclosure is not limited thereto. For example, in some embodiments, the substrate 202 may have a third region 204c. In some embodiments, the substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements, as is known in the art. For example, different doping profiles (e.g., n wells or p wells) may be formed on the substrate 202 in regions designed for different device types (e.g., n-type field-effect transistors (NFET), or p-type field-effect transistors (PFET)). The suitable doping may include ion implantation of dopants and/or diffusion processes.

The first, second and third regions 204a, 204b and 204c are defined for accommodating different devices. For example, the first region 204a may accommodate a high-voltage (HV) device while the second region 204b may accommodate a low-voltage (LV) device. In some embodiments, the HV device used herein is a device having an operating voltage greater than that of the LV device. For example, but not limited thereto, the HV device may have an operating voltage between approximately 25V and approximately 35V, while the LV device may have an operating voltage between approximately 5V and approximately 15V. However, operating voltages can vary for different applications, thus they are not limited herein. For example, the LV device may have an operating voltage lower than approximately 2V. In some embodiments, the third region 204c may accommodate a middle voltage (MV) device. The MV device referred to herein is a device having an operating voltage between those of the LV device and the HV device.

In some embodiments, the HV and MV devices may be planar field-effect transistor (FET) devices, while the LV device may be a non-planar FET device, such as a fin-like FET (FinFET) device.

In some embodiments, in operation 102, a first isolation structure is formed in the first region 204a. In some embodiments, the forming of the first isolation structure includes further operations. Still referring to FIG. 2, a patterned mask layer 206 is formed over the substrate 202. In some embodiments, the patterned mask layer 206 may be a multiple-layered structure. For example, the patterned mask layer 206 may include a first layer 206-1 and a second layer 206-2. The first layer 206-1 may be a silicon oxide layer, and the second layer 206-2 may be a silicon nitride layer, but the disclosure is not limited thereto.

A suitable etching operation is performed to remove portions of the substrate 202 exposed through the patterned mask layer 206. Accordingly, a mesa 208 is formed in the second region 204b. In some embodiments, a top surface of the mesa 208 in the second region 204b is higher than a top surface of the substrate 202 in the first region 204a and the third region 204c, as shown in FIG. 2.

Figure 3:
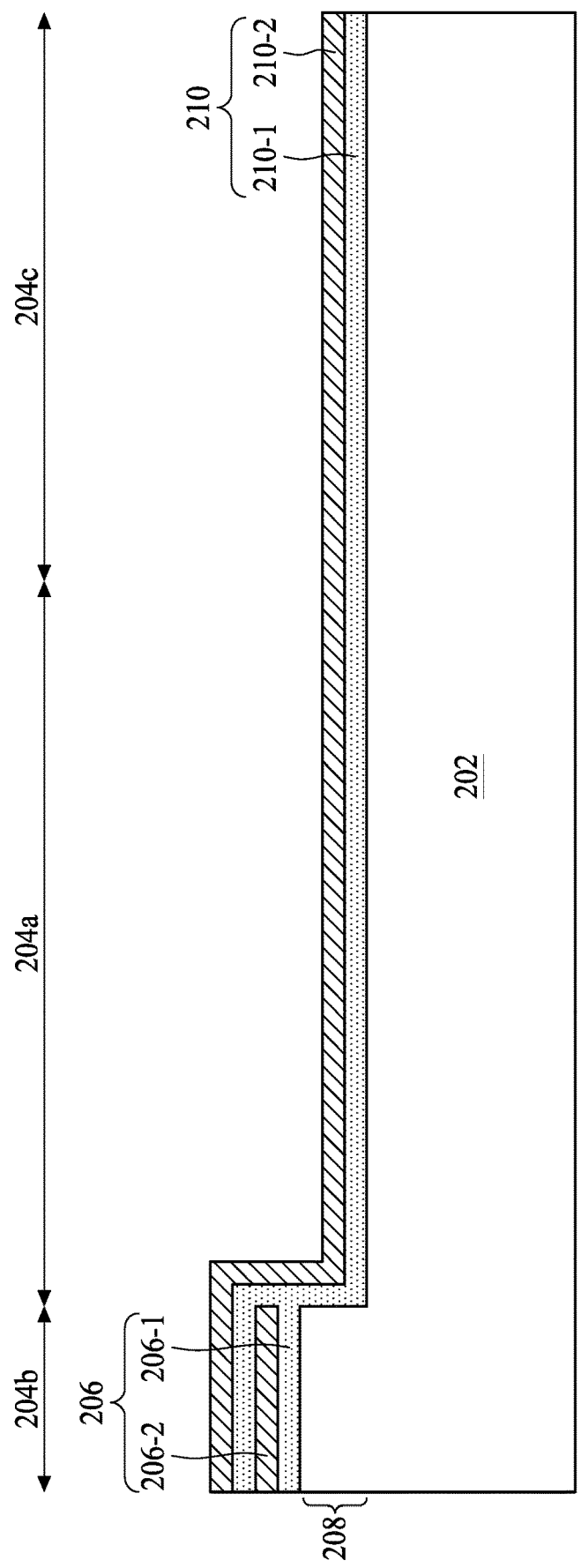

Referring to FIG. 3, in some embodiments, another mask layer 210 is formed over the substrate 202. In some embodiments, the mask layer 210 may be a multiple-layered structure. For example, the mask layer 210 may include a first layer 210-1 and a second layer 210-2. The first layer 210-1 may be a silicon oxide layer, and the second layer 210-2 may be a silicon nitride layer, but the disclosure is not limited thereto. As shown in FIG. 3, the mask layer 210 may be conformally formed over the substrate 202. Therefore, the mask layer 210 covers a top surface of the patterned mask layer 206, a sidewall of the mesa 208 and the top surface of the substrate 202 in the first region 204a and the third region 204c.

Figure 4:
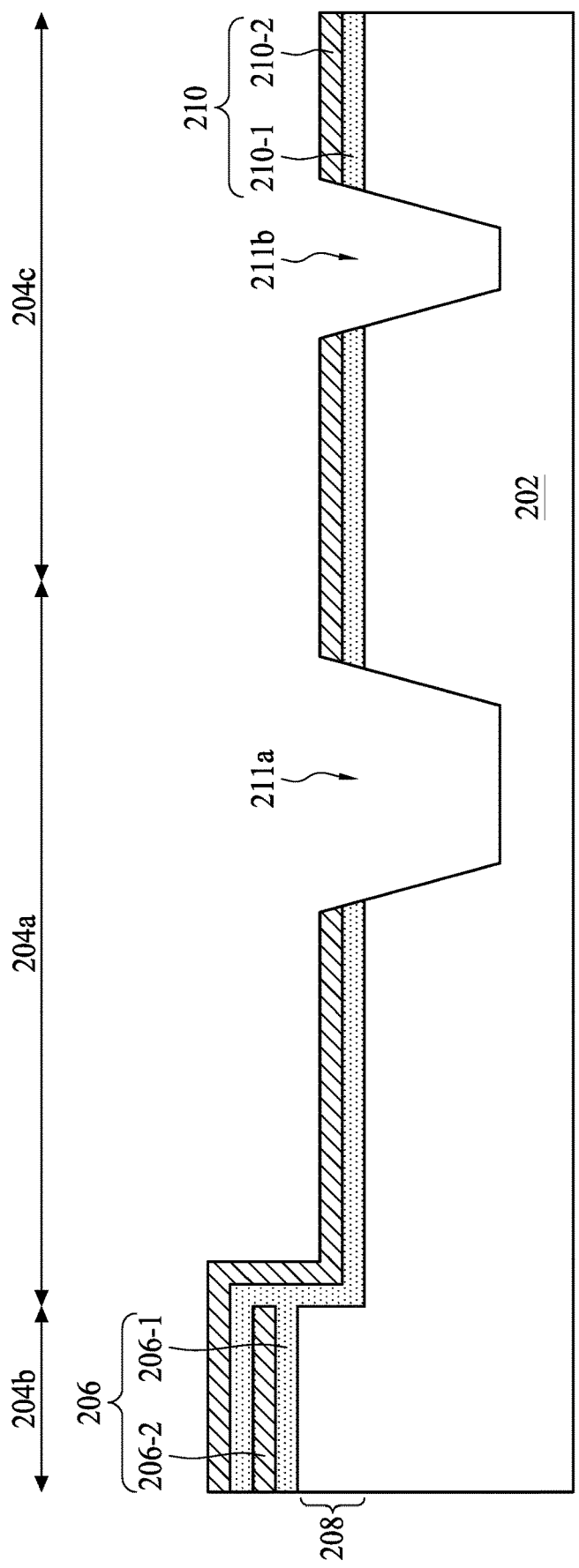

Referring to FIG. 4, the mask layer 210 is next patterned to exposed portions of the substrate 202 in the first region 204a and the third region 204c. A suitable etching operation is subsequently performed to remove the exposed portions of the substrate 202. Accordingly, recesses 211a and 211b are formed. In such embodiments, the mesa 208 is protected by the patterned mask layers 206 and 210. In some embodiments, a depth of the recess 211a in the first region 204a and a depth of the recess 211b in the third region 204c may be similar, but the disclosure is not limited thereto. In some embodiments, a width of the recess 211a is different from a width of the recess 211b. For example, the width of the recess 211a in the first region 204a is greater than the width of the recess 211b in the third region 204c. However, in some alternative embodiments, the widths of the recesses 211a and 211b may be similar, depending on different product designs.

Figure 5:
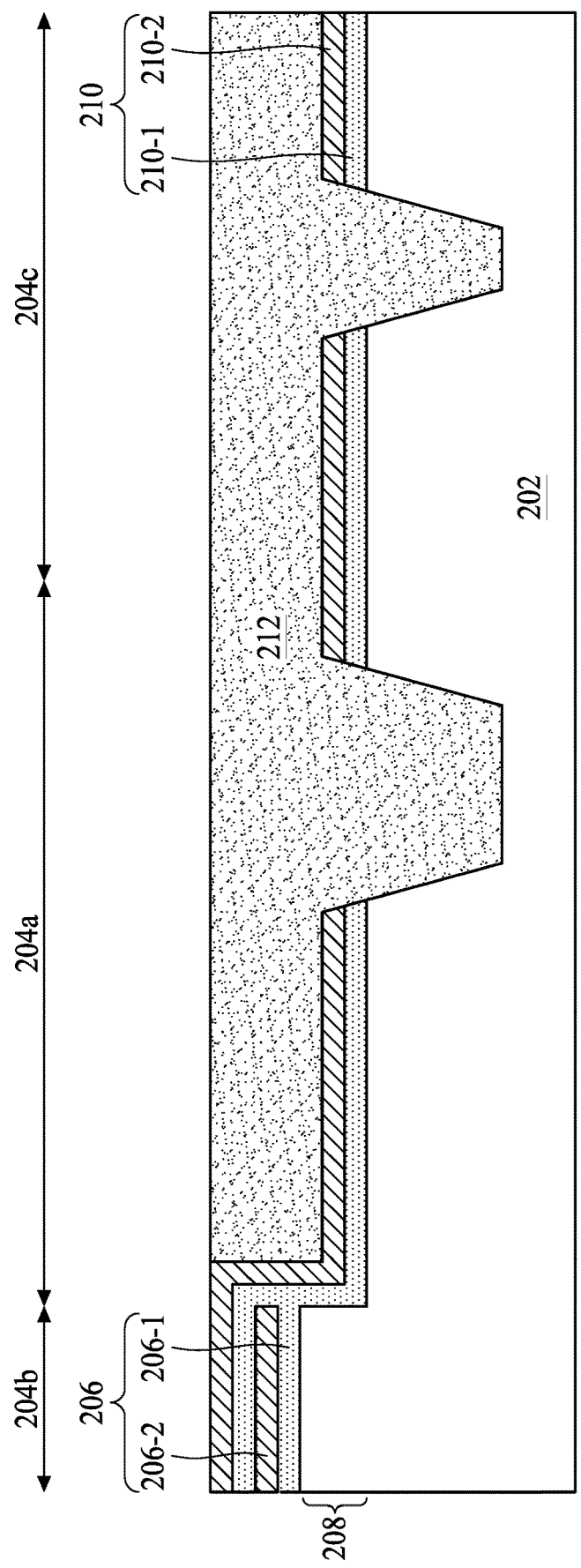

Referring to FIG. 5, in some embodiments, an insulating layer 212 is formed. The recesses 211a and 211b are filled with the insulating layer 212. In some embodiments, the insulating layer 212 may include silicon oxide, but the disclosure is not limited thereto. In some embodiments, the insulating layer 212 not only fills the recesses 211a and 211b, but also covers a top surface of the patterned mask layer 210 over the mesa 208. In such embodiments, a planarization (i.e., a chemical-mechanical polishing (CMP) operation) is performed to remove superfluous material such that a top surface of the insulating layer 212 and the top surface of the patterned mask layer 210 over the mesa 208 are aligned with each other, as shown in FIG. 5.

Figure 6:
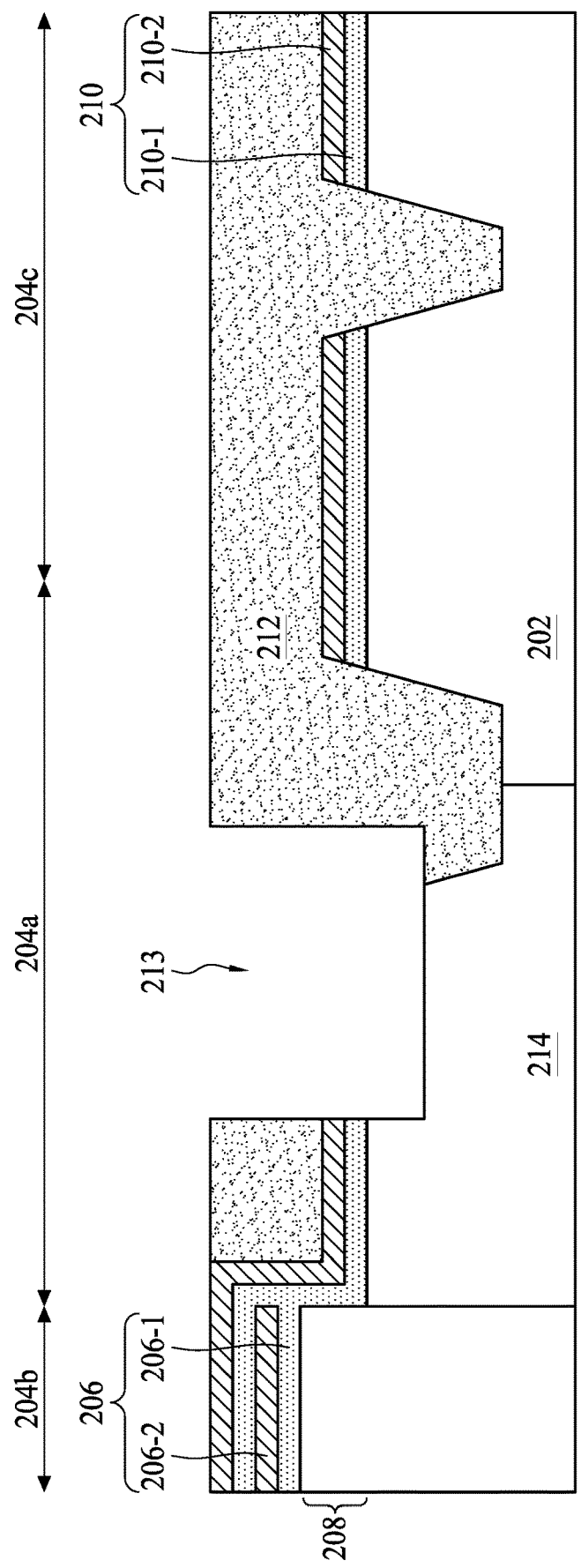

Referring to FIG. 6, in some embodiments, a portion of the insulating layer 212 is removed to expose a portion of the substrate 202 in the first region 204a. The exposed portion of the substrate 202 is then removed, thus forming a recess 213 in the insulating layer 212 and the substrate 202 in the first region 204a, as shown in FIG. 6. In some embodiments the recess 213 may have a bottom formed of the substrate 202 and the first insulating layer 212. For example, a portion of the bottom of the recess 213 is formed by the substrate 202 while another portion of the bottom of the recess 213 is formed by the first insulating layer 212. Additionally, portions of the substrate 202 are exposed through a portion of a sidewall of the recess 213, while portions of the insulating layer 212 are exposed though another portion of the sidewall of the recess 213. In some embodiments, a well 214 may be formed prior to or after the forming of the recess 213, depending on the process design.

Figure 7:
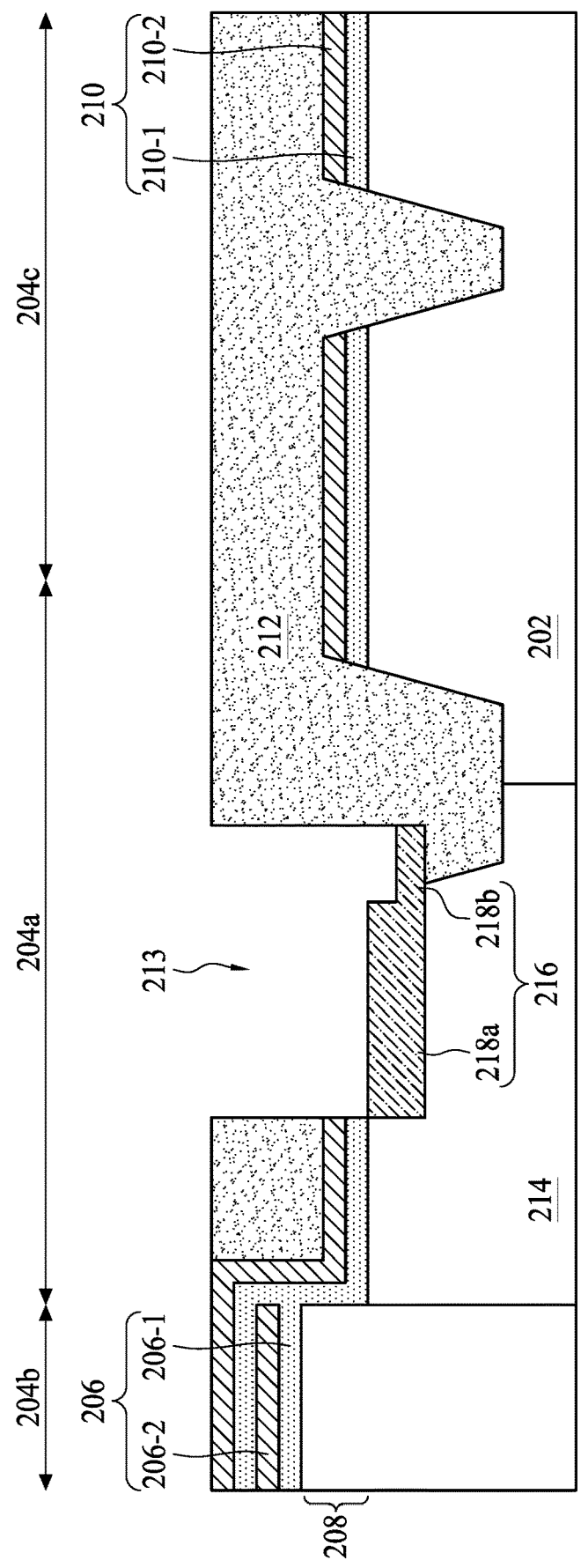

Referring to FIG. 7, in some embodiments, operation 103 may be performed to form a gate dielectric layer. In some embodiments, the forming of the gate dielectric layer may include further operations. For example, a dielectric layer 216 is formed in the recess 213. In some embodiments, the dielectric layer 216 may be a thermal oxide layer. In such embodiments, the dielectric layer 216 may have a first portion 218a formed over the substrate 202 and a second portion 218b formed over the insulating layer 212, wherein a thickness of the first portion 218a is greater than a thickness of the second portion 218b, as shown in FIG. 7.

Figure 8:
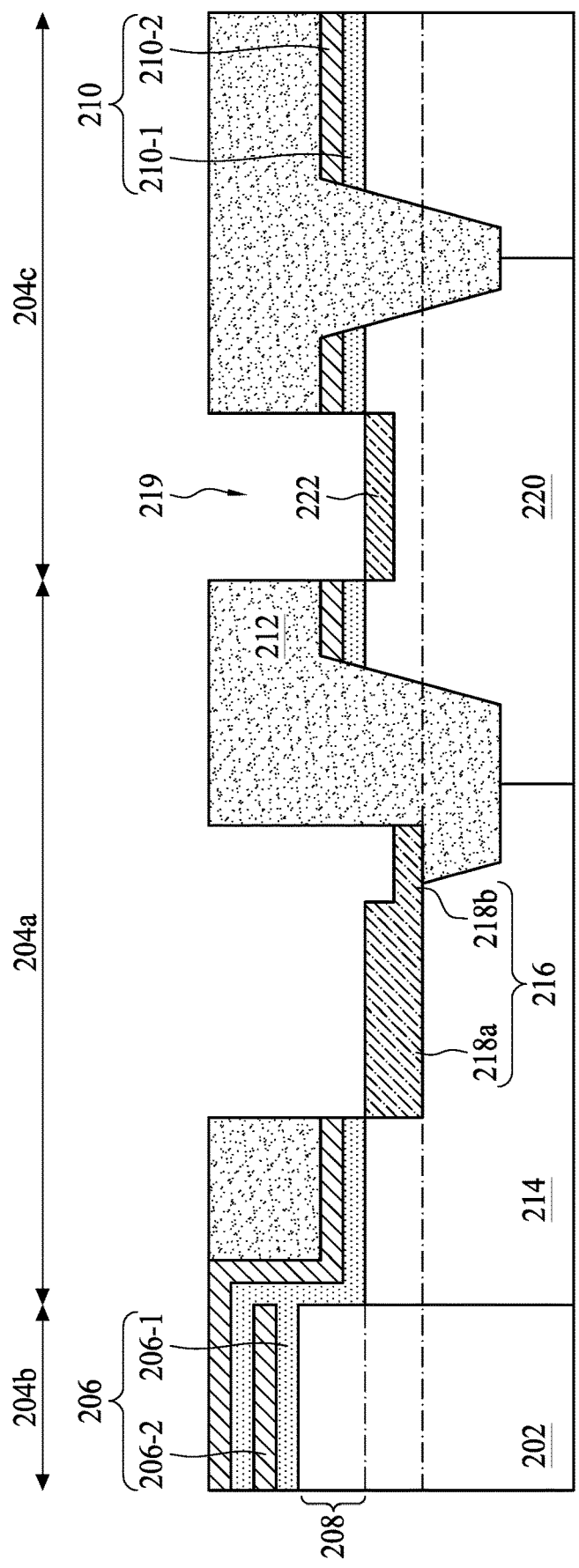

Referring to FIG. 8, in some embodiments, a portion of the insulating layer 212 and a portion of the patterned mask layer 210 are removed to form a recess 219 in the third region 204c. Further, a portion of the substrate 202 in the third region 204c is exposed through the recess 219. In some embodiments, a well region 220 may be formed in the substrate 202 in the third region 204c, as shown in FIG. 8. In such embodiments, a concentration of dopants in the well region 220 is different from a concentration of dopants in the well region 214, in order to accommodate devices of different operating voltages.

Still referring to FIG. 8, in some embodiments, after the forming of the well region 220, a dielectric layer 222 is formed on a bottom of the recess 219. In some embodiments, the dielectric layer 222 and the dielectric layer 216 may include similar materials, but the disclosure is not limited thereto. In some embodiments, a thickness of the dielectric layer 222 is less than a thickness of the dielectric layer 216. In some embodiments, the thickness of the dielectric layer 222 may be between the thickness of the first portion 218a and the thickness of the second portion 218b. In some alternative embodiments, the thickness of the dielectric layer 222 may be less than the thicknesses of the first and second portions 218a and 218b of the dielectric layer 216.

Figure 9:
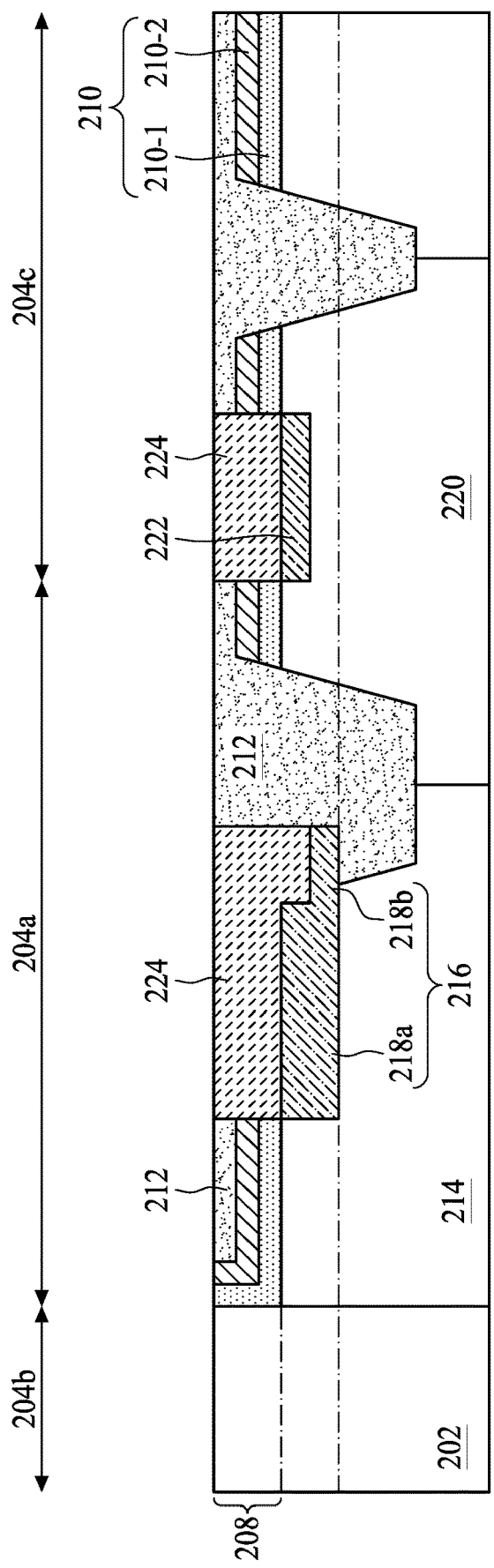

Referring to FIG. 9, in some embodiments, the recesses 213 and 219 are filled with a dielectric layer 224. In some embodiments, a material of the dielectric layer 224 may be similar to that of the dielectric layer 216, but the disclosure is not limited thereto. In some embodiments, a planarization such as a CMP operation may be performed to remove portions of the patterned mask layer 210, the remaining patterned mask 206, a portion of the insulating layer 212 and a portion of the dielectric layer 224. Accordingly, a top surface of the remaining patterned mask layer 210, a top surface of the remaining insulating layer 212 and a top surface of the dielectric layer 224 are aligned with each other. In some embodiments, the abovementioned top surfaces are aligned with the top surface of the mesa 208.

Figure 10:
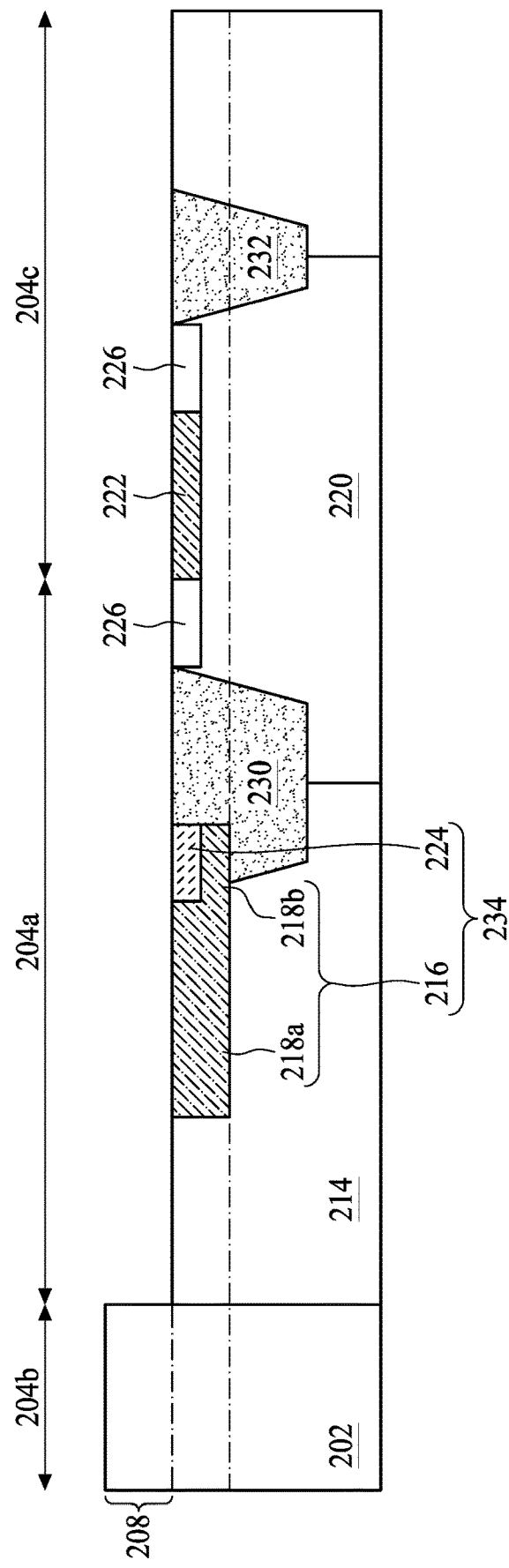

Referring to FIG. 10, in some embodiments, an etching operation is performed to remove the patterned mask layer 210 and portions of the insulating layer 212 and the dielectric layer 224. In such embodiments, an etchant with a high etching ratio of dielectric/insulating materials to the semiconductor material is used. As a result, a smaller portion of the mesa 208 may be consumed when removing the patterned mask layer 210, the insulating layer 212 and the dielectric layer 224. Further, the etching operation may be an isotropic etching operation. Accordingly, the mesa 208 is exposed. An isolation structure 230 is formed in the recess 211a (shown in FIG. 4), an isolation structure 232 is formed in the recess 211b (shown in FIG. 4), and a dielectric structure 234 including remaining portions of the dielectric layers 216 and 224 is formed. Further, a top surface of the substrate 202 in the first region 204a and the third region 204c, a top surface of the dielectric structure 234 (i.e., the remaining first portion 218a of the dielectric layer 216 and the remaining dielectric layer 224), a top surface of the remaining dielectric layer 222, and top surfaces of the isolation structures 230 and 232 are substantially aligned with each other, as shown in FIG. 10. In some embodiments, the dielectric structure 234 serves as a gate dielectric layer of an HV device to be subsequently formed, while the dielectric layer 222 serves as a gate dielectric layer of an MV device to be subsequently formed.

Still referring to FIG. 10, in some embodiments, doped regions 226 may be formed in the third region 204c as needed. In some embodiments, the doped regions 226 may be lightly-doped drains (LDDs), but the disclosure is not limited thereto.

Figure 11:
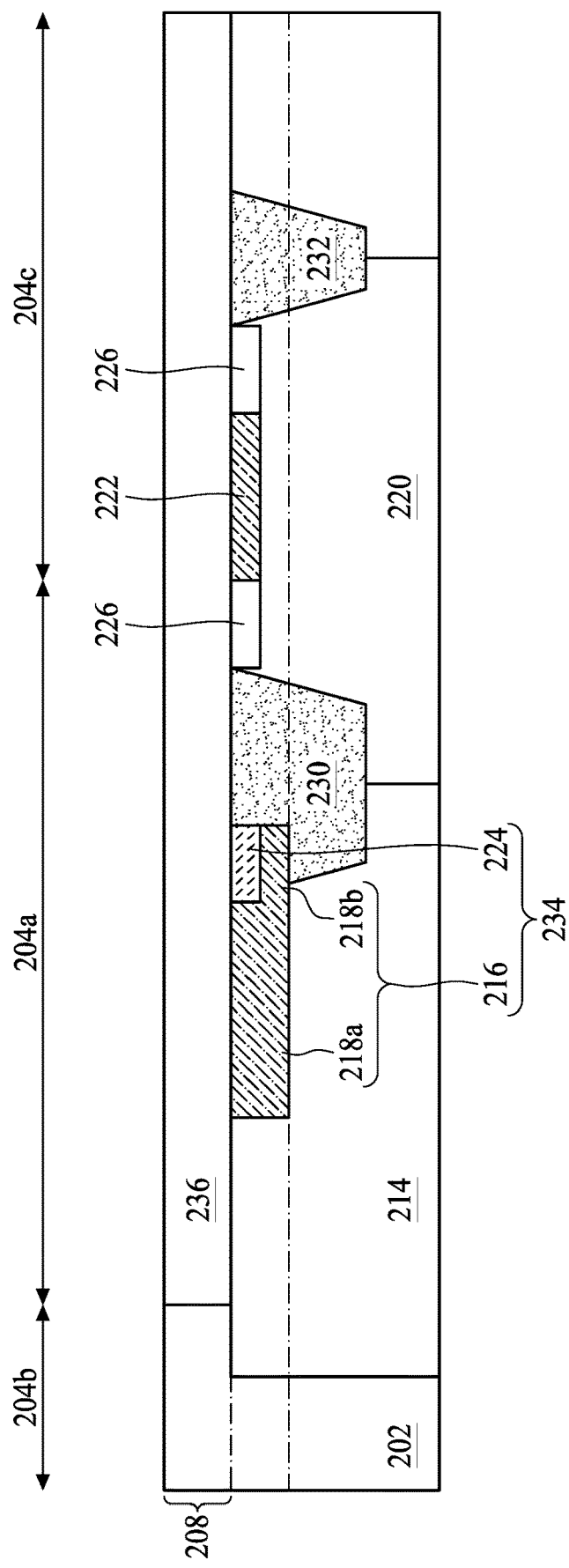

Referring to FIG. 11, in some embodiments, a sacrificial layer 236 is formed over the substrate 202. Further, a top surface of the sacrificial layer 236 is formed to be aligned with the top surface of the mesa 208. Thus, a substantially flush or flat surface is obtained. The flat surface is beneficial for subsequent operations.

Figure 12:
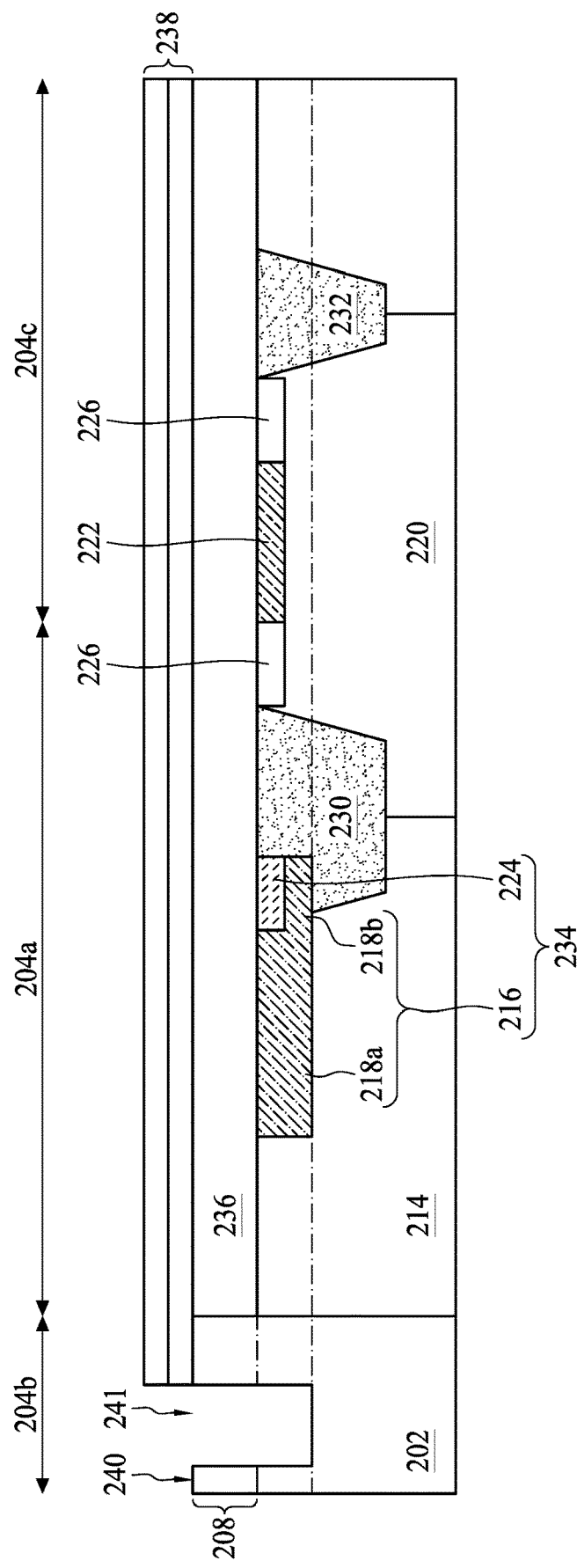

In operation 104, a plurality of fin structures are formed. In some embodiments, the forming of the fin structures includes further operations. For example, as shown in FIG. 12, a protection layer 238 may be formed over the first region 204a and the third region 204c. Subsequently, the plurality of fin structures 240 are formed in the second region 204b. In some embodiments, a plurality of recesses 241 are concurrently formed. Further, the fin structures 240 are separated from each other by the recesses 241. In some embodiments, the recess 241 may be used to define a region where the fin structures 240 are formed in the second region 204b.

Figure 13:
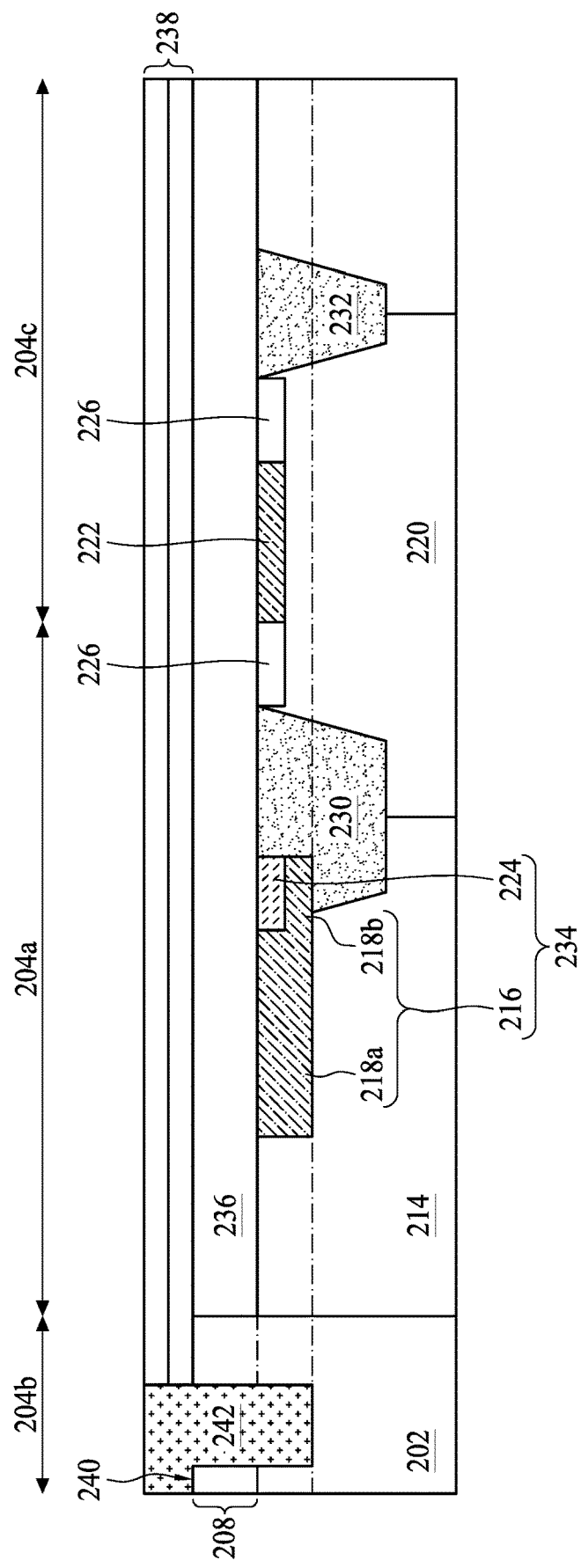

Referring to FIG. 13, in operation 105, a plurality of isolation structures separating the fin structures 240 are formed. In some embodiments, the forming of the isolation structures includes further operations. For example, an insulating layer 242 is formed to fill the recesses 241. Further, the insulating layer 242 may cover top surfaces of the fin structures 240, as shown in FIG. 13. In some embodiments, a top surface of the insulating layer 242 is aligned with a top surface of the protection layer 238, but the disclosure is not limited thereto.

Figure 14:
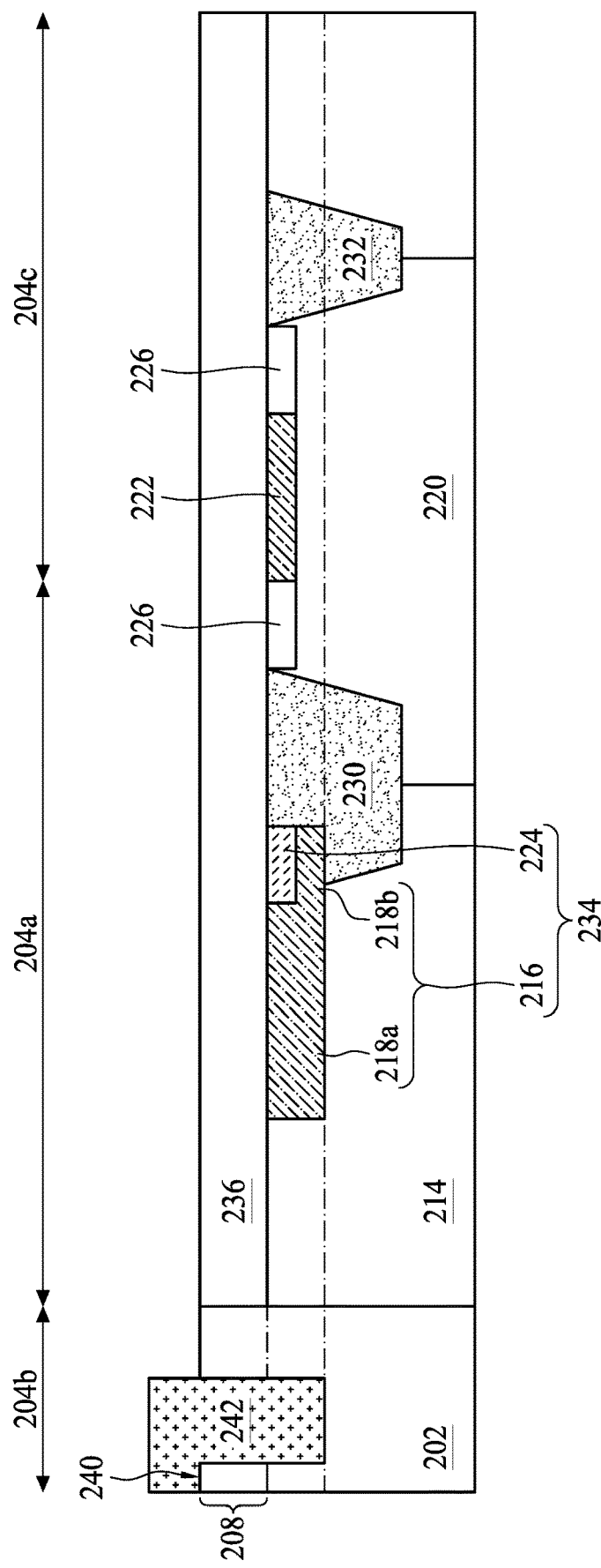

Referring to FIG. 14, in some embodiments, the protection layer 238 is removed after the filling of the recesses 241 and the forming the insulating layer 242.

Figure 15A:
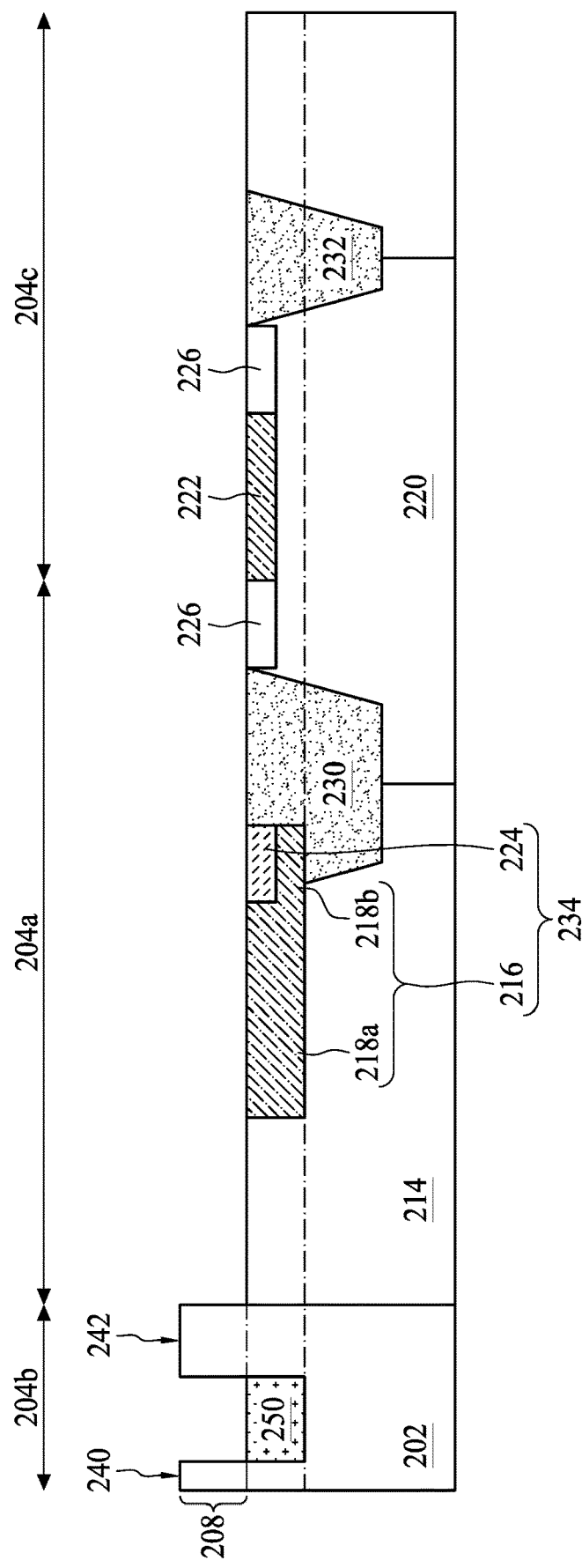
FIGS. 15A and 15B show different cross-sectional views of the semiconductor structure at a fabrication stage subsequent to that in FIG. 14.
Figure 15B:
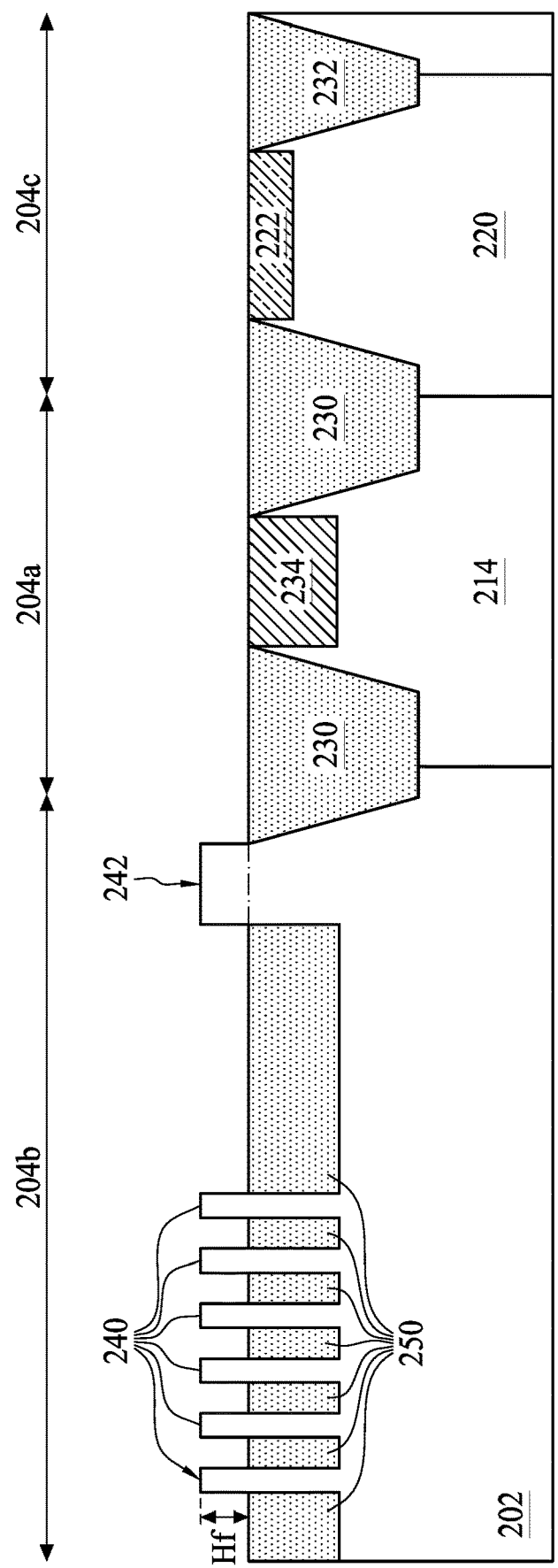

Referring to FIGS. 15A and 15B, an etching operation is performed to remove the sacrificial layer 236 and portions of the insulating layer 242. Thus, the top surface of the substrate 202 in the first region 204a and the third region 204c is exposed. Further, the top surface of the dielectric structure 234, the top surfaces of the isolation structures 230 and 232, and the top surface of the dielectric layer 222 are exposed. In such embodiments, the remaining insulating layer 242 is referred to as the plurality of isolation structures 250. As shown in FIGS. 15A and 15B, the isolation structures 250 not only separate the adjacent fin structures 240, but also separate the fin structures 240 from other elements. Additionally, in some embodiments, the remaining mesa 208 is referred to as a dummy structure 242.

Still referring to FIGS. 15A and 15B, top surfaces of the isolation structures 250 are lower than the top surfaces of the fin structures 240. In some embodiments, a thickness of the isolation structures 250 is substantially equal to a thickness of the dielectric structure 234. Further, the top surfaces of the isolation structures 250 may be aligned with the top surface of the dielectric structure 234, the top surface of the dielectric layer 222 and the top surfaces of the isolation structures 230 and 232.

A fin height Hf of each fin structure 240 is defined as a vertical distance between the top surface of the fin structure 240 and the top surface of the isolation structure 250, as shown in FIG. 15B. In some embodiments, a height of the dummy structure 242 is substantially equal to the fin height Hf of the fin structure 240.

Figure 16A:
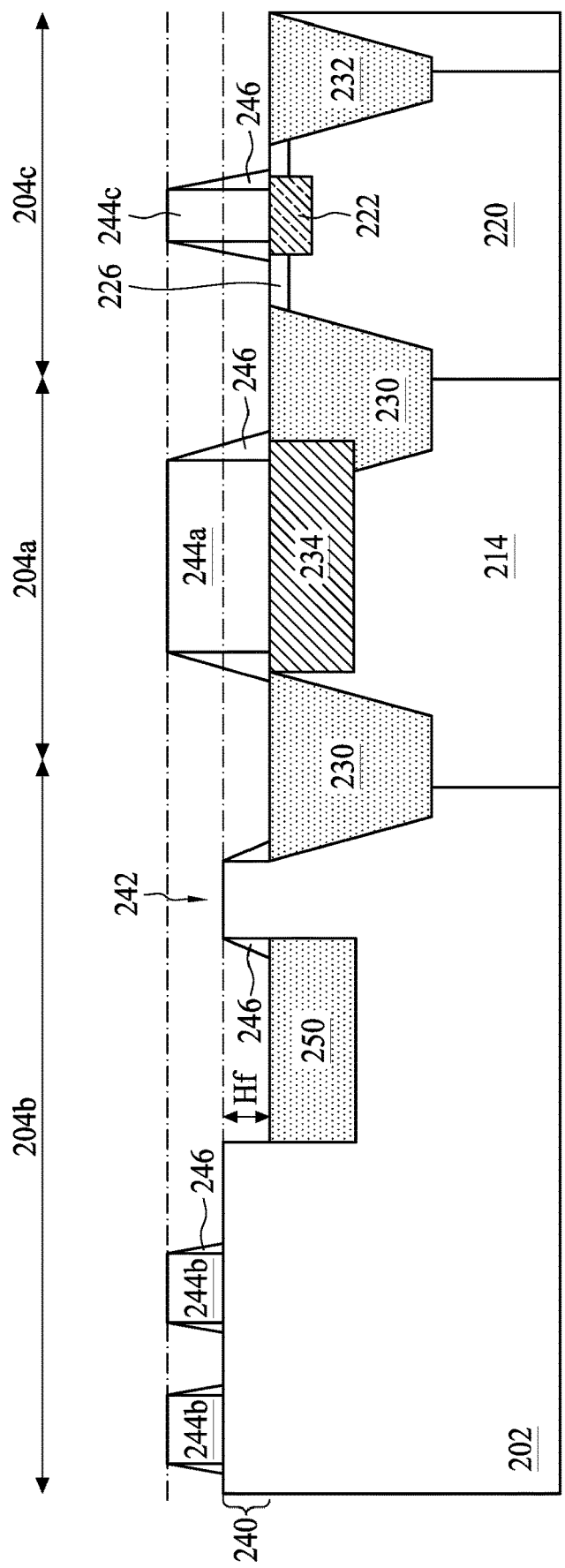
FIGS. 16A and 16B are schematic drawings illustrating the semiconductor structure at a fabrication stage subsequent to that in FIGS. 15A and 15B.
Figure 16B:
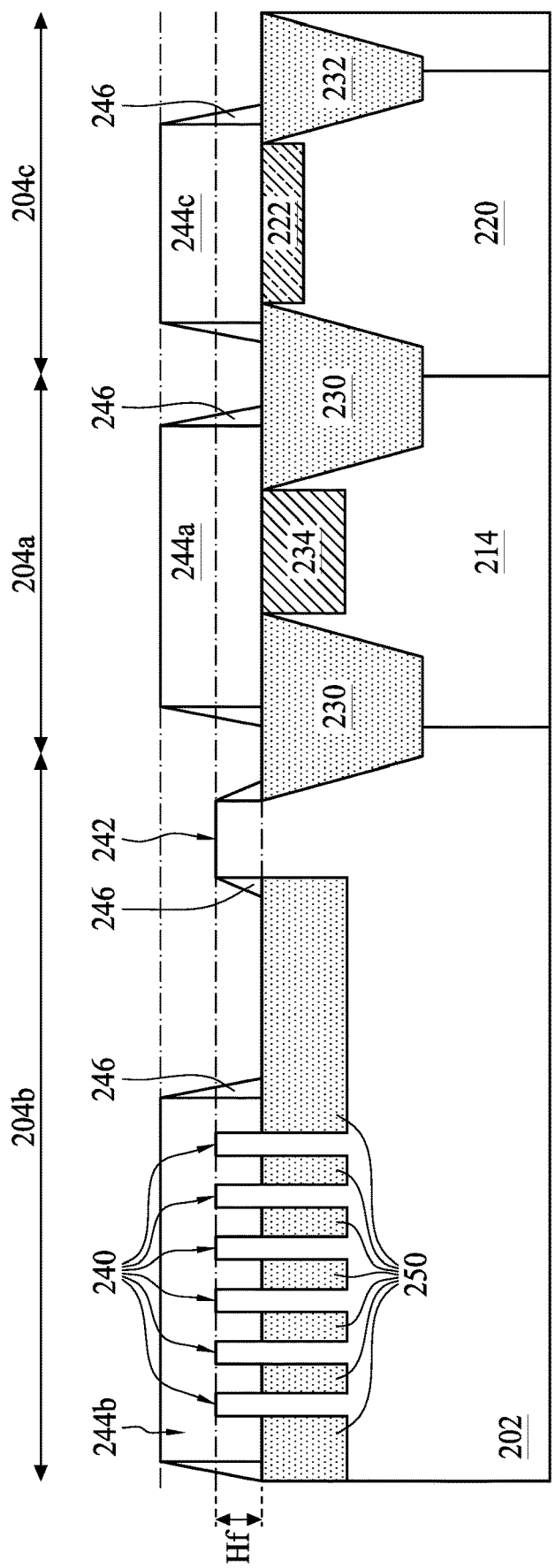

In operation 106, gate structures are formed. In some embodiments, the forming of the gate structures includes further operations. Referring to FIGS. 16A and 16B, gate structures 244a, 244b and 244c are formed over the substrate 202. The gate structure 244a is formed in the first region 204a. Further, the gate structure 244a covers the dielectric structure 234 and a portion of the isolation structure 230. The gate structure 244b is formed in the second region 204b and covers each of the fin structures 240. The gate structure 244c is formed in the third region 204c. Further, the gate structure 244c covers the dielectric layer 222 and a portion of the isolation structure 232. As mentioned above, the dielectric structure 234 and the dielectric layer 222 respectively serve as the gate dielectric layers.

In some embodiments, the gate structures 244a, 244b and 244c are sacrificial gate structures. The sacrificial gate structures 244a, 244b and 244c may respectively include a dielectric layer and a sacrificial semiconductor layer. In some embodiments, the semiconductor layers are made of polysilicon, but the disclosure is not limited thereto. In some embodiments, spacers 246 can be formed over sidewalls of the sacrificial gate structures 244a, 244b and 244c. In some embodiments, the spacers 246 are made of silicon nitride (SiN), silicon carbide (SiC), silicon oxide (SiO), silicon oxynitride (SiON), silicon carbide or any other suitable material, but the disclosure is not limited thereto. In some embodiments, the spacers 246 are formed by deposition and etch-back operations.

Figure 17:
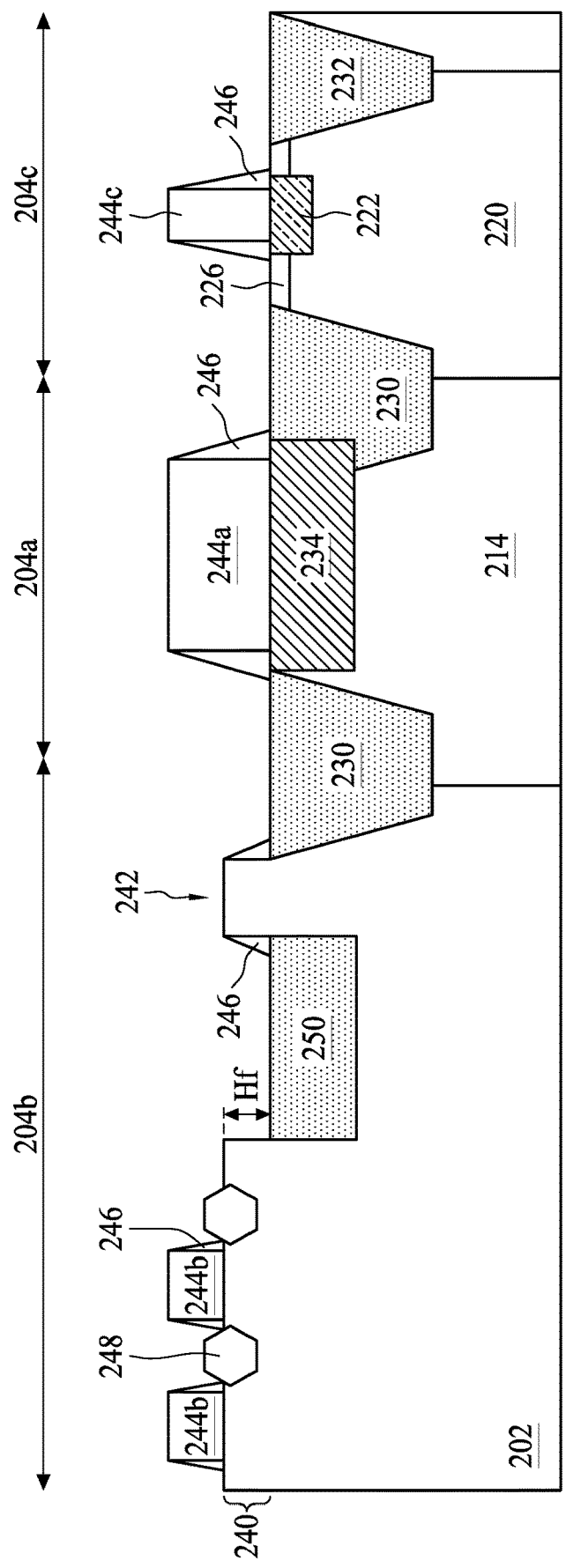
FIG. 17 is a schematic drawing illustrating the semiconductor structure at a fabrication stage subsequent to that in FIG. 16A.

Referring to FIG. 17, portions of the fin structure 240 covered by the gate structure 244b serve as a channel region, and portions of the fin structure 240 exposed through the gate structure 244b serve as a source/drain structure 248. In some embodiments, a height of the source/drain structure 248 may be greater than heights of the fin structures 240. In some embodiments, the source/drain structure 248 may be formed by forming recesses in the fin structures 240 and growing a strained material in the recesses by an epitaxial (epi) process. In addition, a lattice constant of the strained material may be different from a lattice constant of the fin structures 240. Accordingly, the source/drain structure 248 may serve as a stressor that improves carrier mobility. In some embodiments, a source/drain structure may be formed in the substrate 202 at two sides of the gate structure 244a in the first region 204a, and a source/drain structure may be formed in the substrate 202 at two sides of the gate structure 244c in the third region 204c, though not shown. The forming of the source/drain structures in the first and third regions 204a and 204c may be performed simultaneously with, prior to, or after the forming of the source/drain structure 248.

Figure 18A:
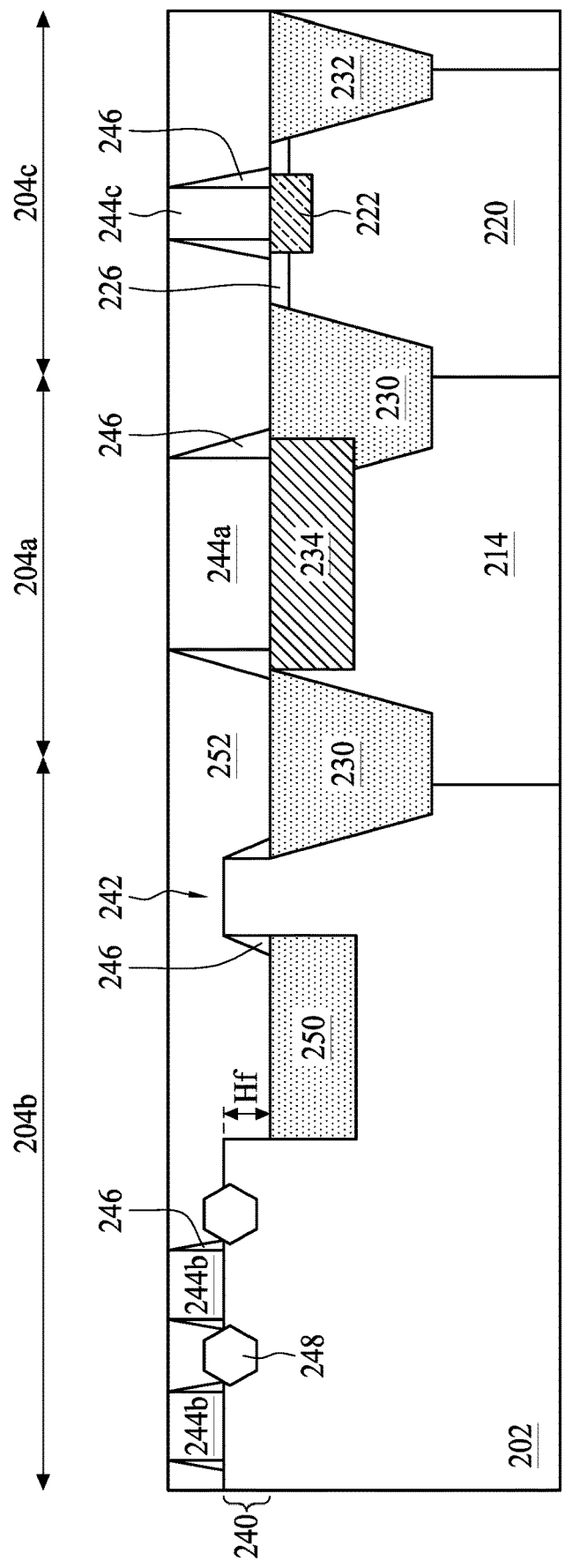
FIGS. 18A and 18B show different cross-sectional views of the semiconductor structure at a fabrication stage subsequent to that in FIG. 17.
Figure 18B:
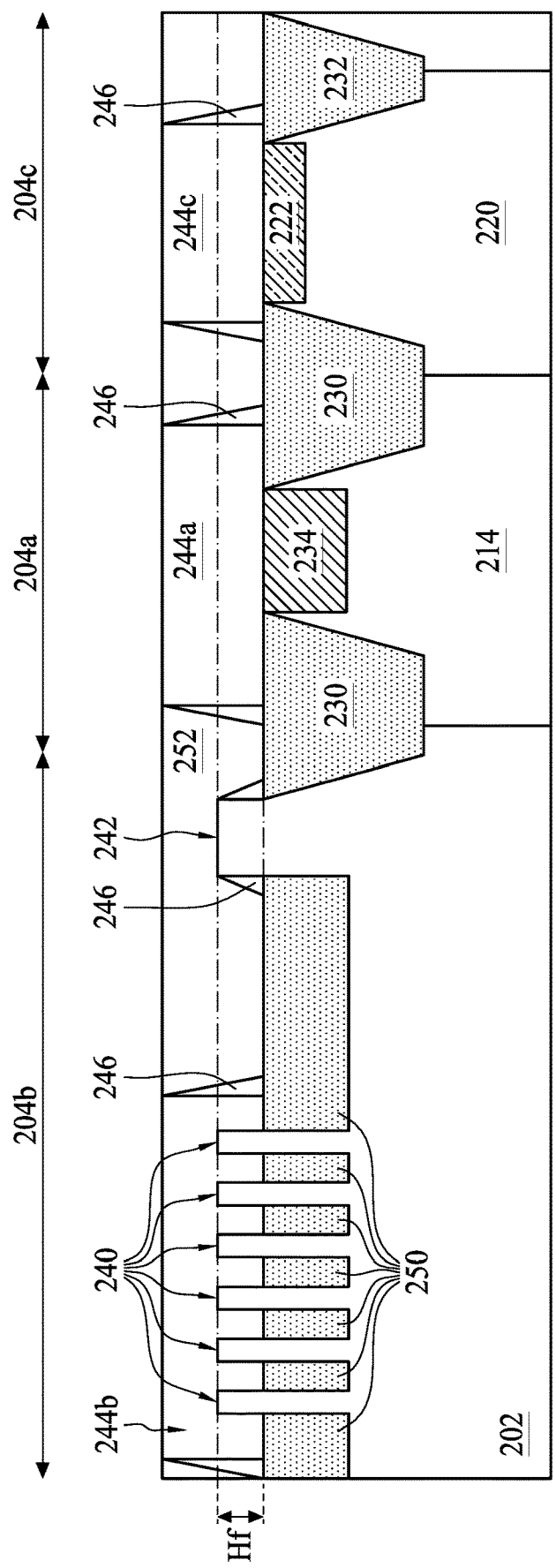

Referring to FIGS. 18A and 18B, in some embodiments, after the forming of the source/drain structures 248, a dielectric structure 252 is formed to cover all the gate structures 244a, 244b and 244c and the dummy structure 242 over the substrate 202. In some embodiments, the dielectric structure 252 may include a contact etch stop layer (CESL). In some embodiments, the CESL can include silicon nitride, silicon oxynitride, and/or other applicable materials. The dielectric structure 252 may include an interlayer dielectric (ILD) structure formed on the CESL in accordance with some embodiments. The ILD structure may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), or polyimide. Next, a polishing process (e.g. a CMP operation) is performed on the dielectric structure 252 to expose top surfaces of the gate structures 244a, 244b and 244c, as shown in FIGS. 18A and 18B.

Figure 19A:
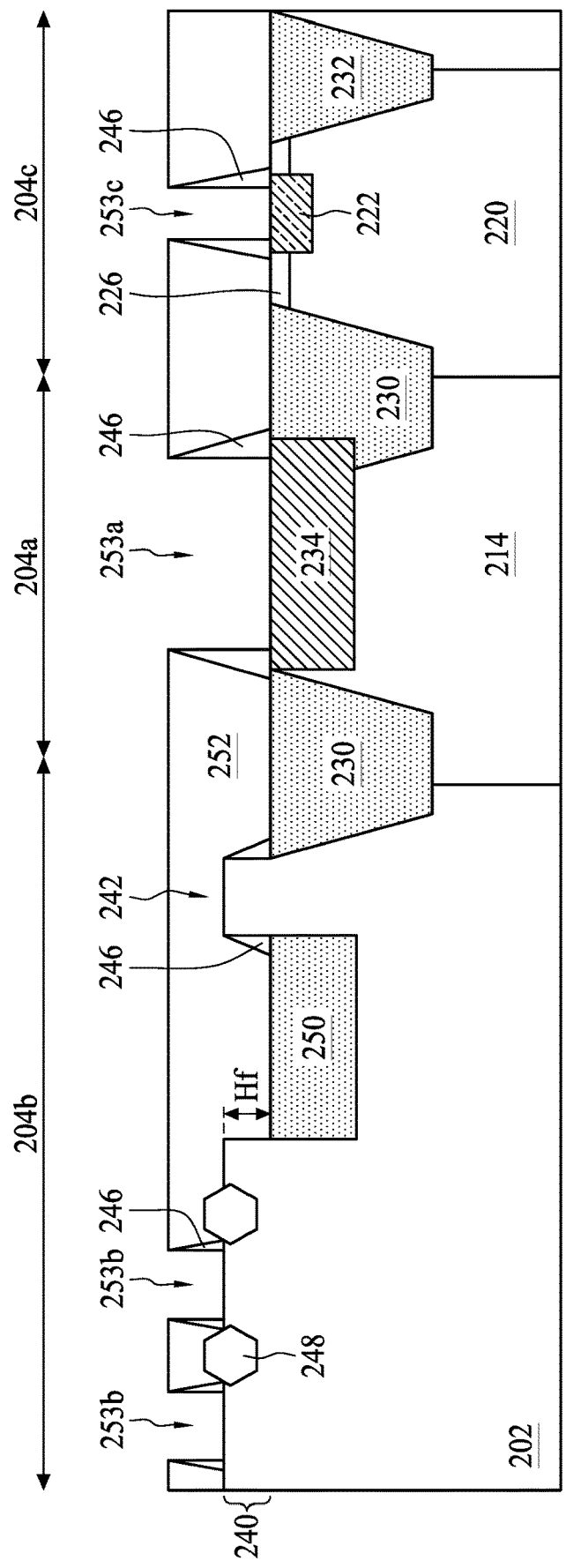
FIGS. 19A and 19B are schematic drawings illustrating the semiconductor structure at a fabrication stage subsequent to that in FIGS. 18A and 18B.
Figure 19B:
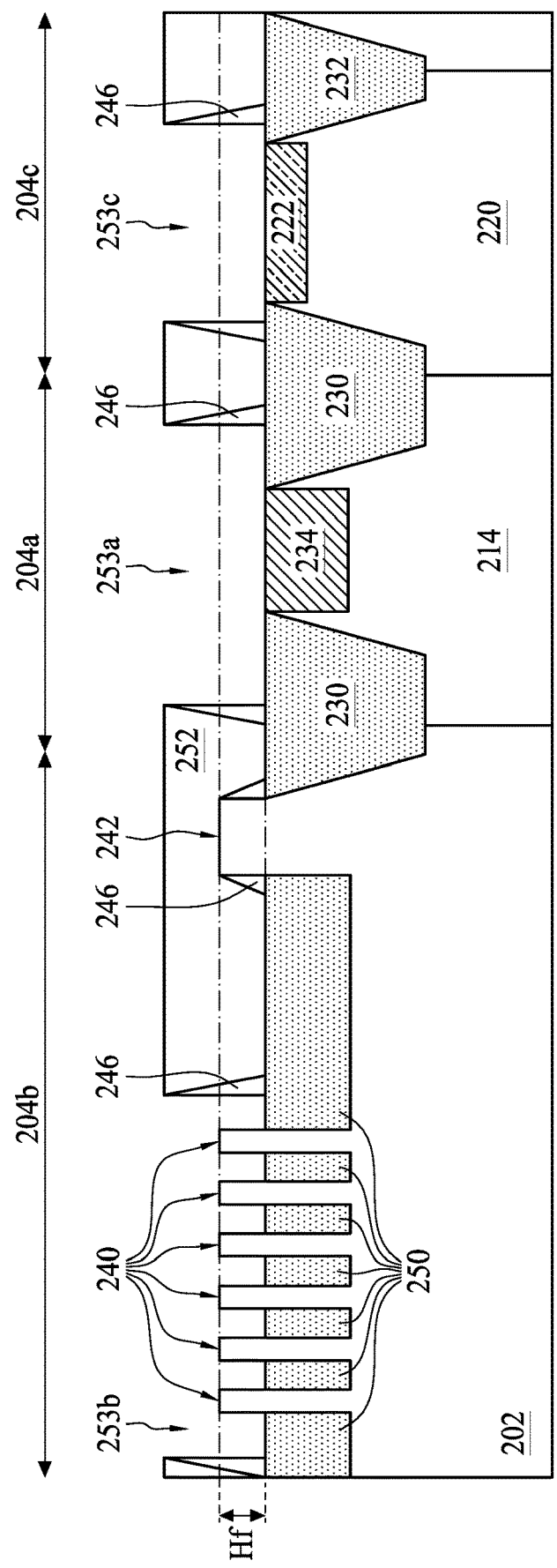

Referring to FIGS. 19A and 19B, in some embodiments, the sacrificial semiconductor layers of the gate structures 244a, 244b and 244c are removed to form gate trenches 253a, 253b and 253c. In some embodiments, the dielectric layer of the gate structure 244b may be removed for forming an interfacial layer (IL). In some embodiments, the dielectric layers of the gate structures 244a and 244c may be left in the gate trench, though not shown. It should be noted that the removal of the dielectric layers may be performed depending on different process or product requirements. Accordingly, the fin structure 240 is exposed through the gate trench 253b.

Additionally, in some embodiments, the removal of the sacrificial semiconductor layer of the gate structure 244b may be performed on the gate structure 244b in the second region 204b, while the gate structures 244a and 244c remain in the first and third regions 204a and 204c.

Figure 20A:
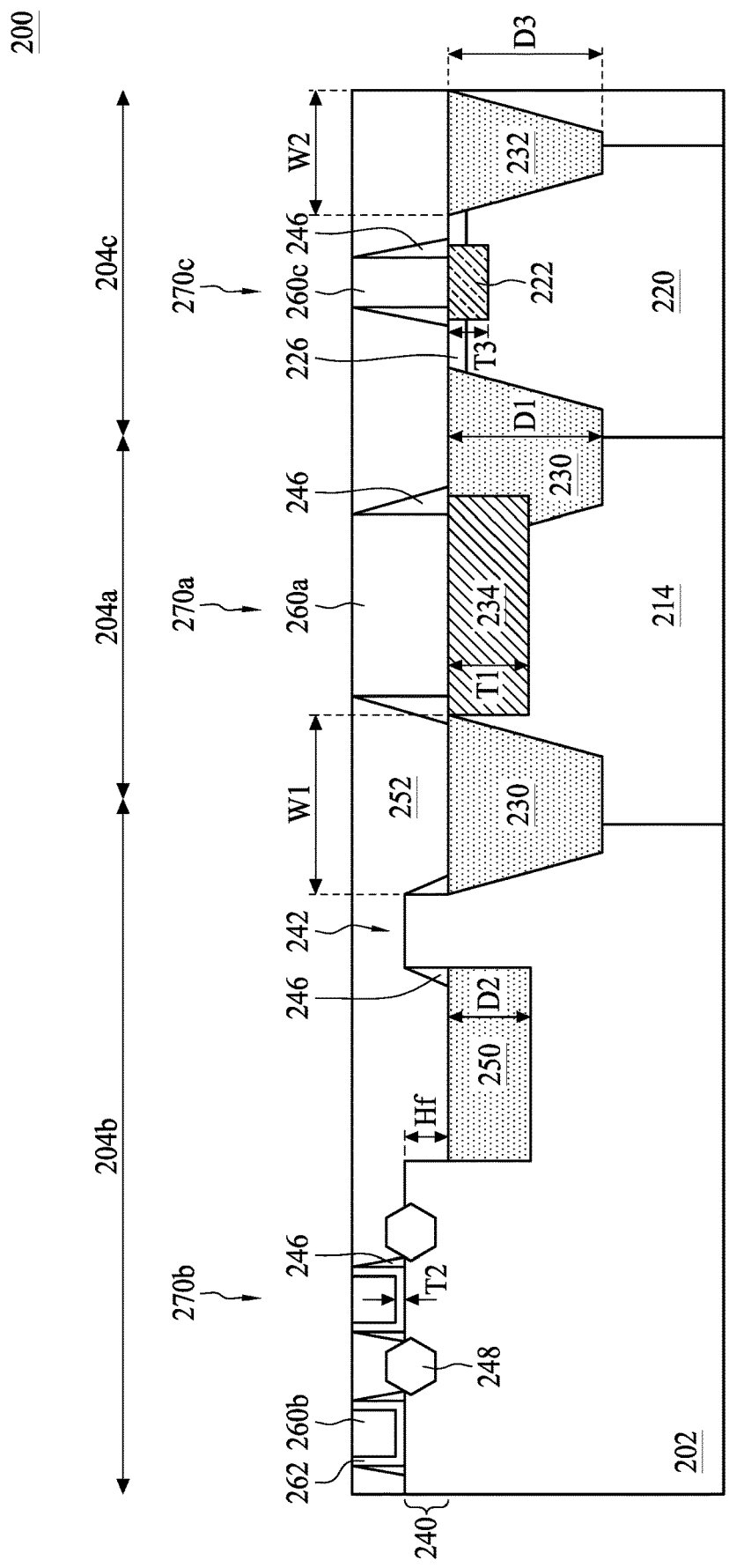
FIGS. 20A and 20B are schematic drawings illustrating the semiconductor structure at a fabrication stage subsequent to that in FIGS. 19A and 19B.
Figure 20B:
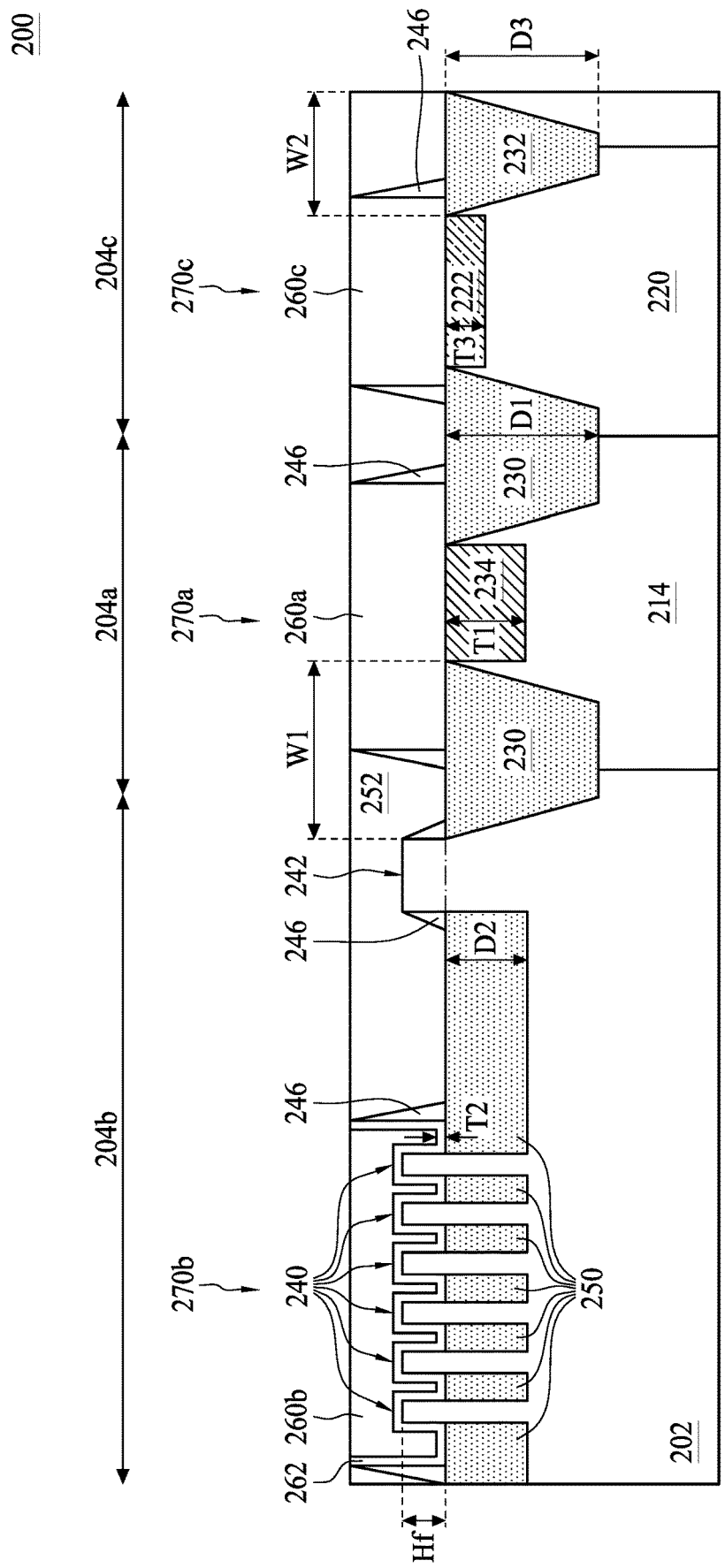

Referring to FIGS. 20A and 20B, in some embodiments, metal gate electrodes 260a, 260b and 260c are formed. In some embodiments, the forming of the metal gate electrodes 260a, 260b and 260c may include further operations. In some embodiments, a high-k gate dielectric layer 262 is formed in the gate trench 253b. In some embodiments, an IL layer may be formed prior to the forming of the high-k gate dielectric layer 262, though not shown.

The IL layer may include an oxide-containing material such as SiO or SiON. In some embodiments, the IL layer covers portions of the fin structures 240 exposed in the gate trench 253b. In some embodiments, the high-k gate dielectric layers 262 may be conformally formed in the gate trench 253b. Accordingly, the high-k gate dielectric layer 262 covers at least sidewalls of the gate trench 253b. In some embodiments, the high-k gate dielectric layers 262 includes a high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfOxNy$), other suitable metal-oxides, or combinations thereof.

In some embodiments, the high-k gate dielectric layer 262 may be formed in the gate trench 253b in the second region 204b, but the gate trenches 253a and 253c in the first and third regions 204a and 204c are free of the high-k gate dielectric layer 262. In some embodiments, the high-k gate dielectric layer 262 may be formed in all the gate trenches 253a, 253b and 253c, though not shown.

In some embodiments, the metal gate electrodes 260a, 260b and 260c respectively include a multiple metal layer 264. In some embodiments, the multiple metal layer 264 includes at least a work function metal layer and a gap-filling metal layer. The work function metal layer may include n-type or p-type work function metal materials, depending on the product design. Further, the work function metal layer may be a single-layered structure or multilayers of two or more materials, but the disclosure is not limited thereto. In some embodiments, a gap-filling metal layer is formed to fill the gate trench 253a, 253b and 253c. In some embodiments, the gap-filling metal layer can include conductive material such as Al, Cu, AlCu or W, but is not limited to the above-mentioned materials.

Accordingly, a semiconductor structure 200 is obtained as shown in in FIGS. 20A and 20B. The semiconductor structure 200 includes the substrate 202 having the first region 204a, the second region 204b and the third region 204c. As mentioned above, the first region 204a may accommodate a first planar FET device such as an HV FET device 270a, the second region 204b may accommodate an non-planar FET device such as an LV FinFET device 270b, and the third region 204c may accommodate a second planar FET device such as an MV FET device 270c. The arrangements of the first, second and third regions 204a, 204b and 204c may be modified depending on different product design.

The first planar FET device 270a includes the isolation structure 230 in the substrate 202, the gate electrode 260a disposed over a portion of the isolation structure 230, and the gate dielectric layer 234 between the substrate 202 and the gate electrode 260a. As mentioned above, the gate electrode 260a may be a metal gate electrode formed using an RPG operation. However, in other embodiments, the RPG operation may be ignored, and the gate electrode 260a may be a polysilicon gate electrode. The gate dielectric layer 234 may include portions 216 and 224, as shown in FIG. 14. Further, the gate dielectric layer 234 has a thickness T1 that is compatible with the HV requirements.

The FinFET device 270b includes the plurality of fin structures 240, the metal electrode 260b over the fin structures 240 and the high-k gate dielectric layer 262 between the metal gate electrode 260b and the fin structures 240. The high-k gate dielectric layer 262 has a thickness T2.

The second planar FET device 270c includes the isolation structure 232 in the substrate 202, a gate electrode 260c disposed over a portion of the isolation structure 232, and the gate dielectric layer 222 between the substrate 202 and the gate electrode 260c. As mentioned above, the gate electrode 260c may be a metal gate electrode formed using an RPG operation. However, in other embodiments, the RPG operation may be ignored, and the gate electrode 260c may be a polysilicon gate electrode. Further, the gate dielectric layer 222 has a thickness T3 that is compatible with the MV requirements.

As mentioned above, the three FET devices 270a. 270b and 270c have different operating voltages: therefore, the thicknesses T1, T2 and T3 are different from each other. In some embodiments, the thickness T1 of the gate dielectric layer 234 of the HV device 270a is greater than the thickness T3 of the gate dielectric layer 222 of the MV device 270c, and the thickness T3 of the gate dielectric layer 222 of the MV device 270c is greater than the thickness T2 of the high-k gate dielectric layer 262 of the LV FinFET device 270b.

The semiconductor structure 200 further includes the plurality of isolation structures 250 disposed in the second region 204b. As mentioned above, the isolation structures 250 separate the adjacent fin structures 240 from each other. Further, the isolation structures 250 separate the LV FinFET device 270b from other devices (i.e., the first and second planar devices 270a and 270c). In some embodiments, the isolation structures 230 and 232 are provided for devices having operating voltages greater than that of the LV FinFET device 270b; therefore, depths D1 and D3 of the isolation structures 230 and 232 are greater than a depth D2 of the isolation structure 250. In some embodiments, the depth D1 of the isolation structure 230 and the depth D3 of the isolation structure 232 may be similar. However, in some alternative embodiments, the depth D1 of the isolation structure 230 is greater than the depth D3 of the isolation structure 232. Further, in some embodiments, because the isolation structure 230 is provided for the HV device 270a, while the isolation structure 232 is provided for the MV device 270c, a width of the isolation structure 230 is greater than a width of the isolation structure 232, as shown in FIGS. 20A and 20B.

Additionally, in some embodiments, the thickness T1 of the gate dielectric layer 234 is substantially equal to the depth D2 of the isolation structure 250, but the disclosure is not limited thereto.

In some embodiments, a top surface of the isolation structures 250, a top surface of the isolation structure 230, and a top surface of the isolation structure 232 are aligned with each other. Further, in some embodiments, a top surface of the gate dielectric layer 234 and a top surface of the gate dielectric layer 222 are aligned with the above-mentioned top surfaces.

In some embodiments, heights of the gate electrodes 260a, 260b and 260c are substantially the same. In such embodiments, top surfaces of the gate electrodes 260a, 260b and 260c are aligned with each other.

In some embodiments, the semiconductor structure 200 further includes a dummy structure 242 formed between the gate electrode 260b and other elements (i.e., the gate electrode 260a). A height of the dummy structure 242 may be substantially equal to the fin height Hf of the fin structures 240. The dummy structure 242 includes a material same as a material of the substrate 202. In some embodiments, the dummy structure 242 may be removed.

In summary, the present disclosure provides a method for forming a semiconductor structure. The method may be integrated into an HKMG process. The method integrates a planar device and a non-planar device. In some embodiments, the method for forming the semiconductor structure includes forming isolation structures and gate dielectric layers for the planar device prior to forming the non-planar device. Thus, issues such as the isolation structures having different dimensions and the gate dielectric layers having different thicknesses are mitigated. The method thereby helps the semiconductor structure to meet multiple-Vt structure requirements.

Some embodiments of the present disclosure provide a semiconductor structure. The semiconductor structure includes a substrate, a first FET device and a second FET device. The substrate has a first region and a second region. The first FET device is disposed in the first region, and the second FET device is disposed in the second region. The first FET device includes a first isolation structure disposed in the substrate, a first gate electrode disposed over a portion of the first isolation structure, and a first gate dielectric layer between the substrate and the first gate electrode. The first gate dielectric layer has a first thickness. The second FET device includes a plurality of fin structures, a plurality of second isolation structures separating the fin structures, a second gate electrode disposed over the plurality of fin structures, and a second gate dielectric layer between the second gate electrode and the plurality of fin structures. The second gate dielectric layer has a second thickness. The second thickness is less than the first thickness.

Some embodiments of the present disclosure provide a semiconductor structure. The semiconductor structure includes a non-planar FET device, a first planar FET device and a second planar FET device. The non-planar FET device includes a plurality of fin structures, a metal gate electrode over the plurality of fin structures, and a first gate dielectric layer between the metal gate electrode and the plurality of fin structures. The first planar FET device includes a first isolation structure, a first gate electrode covering a portion of the first isolation structure, and a second gate dielectric layer under the first gate electrode. The second planar FET device includes a second isolation structure, a second gate electrode covering a portion of the second isolation structure, and a third gate dielectric layer under the second gate electrode. The first isolation structure has a first width, and the second isolation structure has a second width. The second width is less than the first width. A thickness of the first dielectric layer is less than a thickness of the third gate dielectric layer, and the thickness of the third gate dielectric layer is less than a thickness of the second gate dielectric layer.

Some embodiments of the present disclosure provide a method for forming a semiconductor structure. The method includes following operations. A substrate having a first region and a second region is received. A first isolation structure is formed in the first region. A first gate dielectric layer is formed in the first region. A plurality of fin structures are formed in the second region after the forming of the first gate dielectric layer. A plurality of second isolation structures separating the fin structures are formed in the second region. A first gate electrode is formed over the first gate dielectric layer in the first region, and a second gate electrode is formed over the fin structures in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   receiving a substrate having a first region and a second region;
   forming a first isolation structure in the first region;
   forming a first gate dielectric layer in the first region;
   forming a plurality of fin structures in the second region after the forming of the first gate dielectric layer;
   forming a plurality of second isolation structures separating the fin structures in the second region; and
   forming a first gate structure over the first gate dielectric layer in the first region and a second gate structure over the fin structures in the second region,
   wherein the forming of the first isolation structure and the first gate dielectric layer further comprises:
   forming a patterned mask layer over the substrate;
   forming a first recess in the first region;
   filling the first recess with a first insulating layer;
   forming a second recess exposing a portion of the first insulating layer and a portion of the substrate; and
   forming the first gate dielectric layer in the second recess.

2. The method of claim 1, wherein the forming of the plurality of fin structures and the forming of the second isolation structure further comprise:

forming a mesa in the second region;
removing portions of the mesa to form the plurality of fin structures and a plurality of third recesses separating the fin structures;
filling the third recess with a second insulating layer; and
removing a portion of the second insulating layer to form the second isolation structures.

3. The method of claim 1, further comprising forming a dummy structure during the forming of the fin structures.

4. The method of claim 1, further comprising replacing a first sacrificial gate of the first gate structure with a first metal gate, and replacing a second sacrificial gate of the second gate structure with a second metal gate.

5. A method for forming a semiconductor structure, comprising:
receiving a substrate having a first region and a second region;
forming a first isolation structure in the first region and a second isolation structure in the second region;
forming a first gate dielectric layer in the first region and a second dielectric layer in the second region, wherein a thickness of the first gate dielectric layer is greater than a thickness of the second gate dielectric layer, a top surface of the first gate dielectric layer is aligned with a top surface of the second gate dielectric layer, and a bottom surface of the second gate dielectric layer is lower than a top surface of the second isolation structure;
forming a doped region in the second region; and
forming a first gate structure over the first gate dielectric layer in the first region and a second gate structure over the second gate dielectric layer in the second region.

6. The method of claim 5, wherein a top surface of the first isolation structure is aligned with the top surface of the second isolation structure.

7. The method of claim 6, wherein the top surface of the first isolation structure, the top surface of second isolation structure, the top surface of the first gate dielectric layer and the top surface of the second gate dielectric layer are aligned with each other.

8. The method of claim 5, wherein a width of the first isolation structure is greater than a width of the second isolation structure.

9. The method of claim 5, wherein the first gate structure comprises a first metal gate structure, and the second gate structure comprises a second metal gate structure.

10. The method of claim 9, further comprising:
forming a first sacrificial gate structure over the first gate dielectric layer in the first region, and a second sacrificial gate structure over the second gate dielectric layer in the second region;
removing the first sacrificial gate structure and the second sacrificial gate structure to form a first gate trench in the first region and a second gate trench in the second region; and
forming the first metal gate structure in the first gate trench and the second metal gate structure in the second gate trench.

11. The method of claim 5, wherein a width of the first gate structure is greater than a width of the second gate structure.

12. A method for forming a semiconductor structure, comprising:
receiving a substrate having a first region, a second region and a third region;
forming a first isolation structure in the first region and a second isolation structure in the third region;
forming a first gate dielectric layer in the first region and a second gate dielectric layer in the third region, wherein a thickness of the first gate dielectric layer is greater than a thickness of the second gate dielectric layer;
forming a plurality of fin structures in the second region after the forming of first gate dielectric layer and the second gate dielectric layer;
forming a plurality of third isolation structures separating the fin structures in the second region, wherein thicknesses of the third isolation structures are less than a thickness of the first isolation structure and less than a thickness of the second isolation structure; and
forming a first metal gate structure over the first gate dielectric layer in the first region, a second metal gate structure over the fin structures in the second region, and a third metal gate structure over the second gate dielectric layer in the third region.

13. The method of claim 12, further comprising forming a dummy structure between the first isolation structure and at least one of the third isolation structures.

14. The method of claim 13, wherein a top surface of the fin structure is aligned with a top surface of the dummy structure.

15. The method of claim 13, wherein the forming of the dummy structure further comprises:
forming a mesa over the substrate in the second region; and
removing portions of the mesa to form the fin structures and the dummy structure.

16. The method of claim 15, wherein the dummy structure and from the fin structures are simultaneously formed.

17. The method of claim 12, wherein the forming of the first metal gate structure, the second metal gate structure and the third metal gate further comprises:
forming a first sacrificial gate structure over the first gate dielectric layer, a second sacrificial gate structure over the fin structure, and a third sacrificial gate structure over the second gate dielectric layer;
removing the first sacrificial gate structure to form a first gate trench, removing the second sacrificial gate structure to form a second gate trench, and removing the third sacrificial gate structure to form a third gate trench; and
forming the first metal gate structure in the first gate trench, forming the second metal gate structure in the second gate trench, and forming the third metal gate structure in the third gate trench.

18. The method of claim 17, further comprising forming a doped region in the third region prior to the forming of the third sacrificial gate structure.

19. The method of claim 17, further comprising forming a third gate dielectric layer over the fin structure in the second gate trench prior to the forming of the second metal gate structure.

20. The method of claim 19, wherein the thickness of the second gate dielectric layer is greater than a thickness of the third gate dielectric layer.

* * * * *